US006100161A

United States Patent [19]

Yu et al.

[11] Patent Number: 6,100,161

[45] Date of Patent: Aug. 8, 2000

[54] METHOD OF FABRICATION OF A RAISED SOURCE/DRAIN TRANSISTOR

[75] Inventors: Xing Yu, Singapore, Singapore; Ying Keung Leung, Aberdeen, The Hong Kong Special Administrative Region of the People's Republic of China; Hong Yang, Dallas, Tex.; Shyue Fong Quek, Petaling Jaya, Malaysia

[73] Assignee: Chartered Semiconductor Manufacturing Ltd., Singapore, Singapore

[21] Appl. No.: 09/442,494

[22] Filed: Nov. 18, 1999

[51] Int. Cl.[7] .......................... H01L 21/76; H01L 21/4763; H01L 21/336

[52] U.S. Cl. .......................... 438/424; 438/435; 438/437; 438/649; 438/300; 438/504

[58] Field of Search .......................... 438/279, 296, 438/300, 301, 302, 303, 304, 306, 307, 424, 437, 435, 583, 564, 655, 595, 622, 649; 257/336, 338, 444

[56] References Cited

U.S. PATENT DOCUMENTS

| | | | |
|---|---|---|---|
| 5,843,826 | 12/1998 | Hong | 438/300 |
| 5,858,848 | 1/1999 | Gardner et al. | 438/305 |
| 5,874,341 | 2/1999 | Gardner et al. | 438/301 |
| 5,879,998 | 3/1999 | Krivokapic | 438/300 |
| 5,918,130 | 6/1999 | Hause et al. | 438/290 |
| 5,930,645 | 7/1999 | Lyons et al. | 438/424 |
| 5,989,975 | 11/1999 | Kuo | 438/424 |
| 6,001,721 | 12/1999 | Huang | 438/597 |
| 6,033,963 | 3/2000 | Huang et al. | 438/303 |
| 6,037,238 | 3/2000 | Chang et al. | 438/426 |

*Primary Examiner*—Brian Dutton
*Assistant Examiner*—Brook Kebede
*Attorney, Agent, or Firm*—George O. Saile; Rosemary L. S. Pike; Stephen Stanton

[57] ABSTRACT

A method of fabricating a transistor, comprising the following steps. A silicon semiconductor substrate having a pad oxide portion within an active area is provided. A polysilicon layer is deposited over the silicon semiconductor substrate and over the pad oxide portion. A pad oxide layer is deposited over the polysilicon layer. Shallow isolation trench regions are formed on either side of the active area. The pad oxide layer is removed. The polysilicon layer is etched and removed over the pad oxide portion leaving polysilicon portions between the pad oxide portion and the shallow isolation trench regions. The pad oxide portion is replaced with a gate oxide portion. A gate conductor, having exposed side walls, is formed over the gate oxide portion and between the polysilicon portions. Sidewall spacers are formed on the exposed side walls of the gate conductor with the sidewall spacers contacting the polysilicon portions. Source/drain regions are formed in the active area under the sidewall spacers and under the polysilicon portions. A salicide portion is formed over the gate conductor and salicide portions are formed over the polysilicon portions, whereby the formation of the salicide layers over the polysilicon portions consumes a portion of the polysilicon portions leaving the remainder of the polysilicon layers to form shallow source/drain junctions underneath the polysilicon portion salicide portions.

14 Claims, 3 Drawing Sheets

METHOD OF FABRICATION OF A RAISED SOURCE/DRAIN TRANSISTOR

FIELD OF THE INVENTION

The present invention relates generally to semiconductor transistors, and specifically to a method of fabricating an improved semiconductor transistor having a thick metal silicide layer over the gate electrode and source/drain regions.

BACKGROUND OF THE INVENTION

Semiconductor transistors comprise the backbone of integrated circuits. Field-effect transistors (FETs) or metal-oxide semiconductor field-effect transistors (MOSFETs) are the most common transistors. Silicide formation over the source/drain regions and/or gate electrode provide the advantages of lowering the resistivity of the FET formed, improves the FET's performance, and provides a contact region. It is desirable to have sufficiently thick silicide layers over the source/drain regions to lower resistivity while also having a shallow junction below the silicide layers.

U.S. Pat. No. 5,843,826 to Hong describes a method of forming a FET that occupies a reduced surface area on a substrate because is incorporates elevated source/drain contacts provided at least partially over the field oxide regions. A conventional self-aligned silicide (salicide) process is used to form a titanium silicide or other metal silicide over the gate electrode and over the source/drain regions and the elevated poly structures over the field oxide regions.

U.S. Pat. No. 5,858,848 to Gardner et al. describes a method of forming self-aligned nitride sidewall spacers between opposed sidewall surfaces of a gate conductor and a sacrificial dielectric sidewall. A metal salicide may be formed over the source/drain and gate electrode.

U.S. Pat. No. 5,874,341 to Gardner et al. describes a method of forming an insulated-gate field-effect transistor (IGFET), such as a MOSFET, with a gate electrode in a trench, i.e. a trench transistor, and a source contact in the trench. Titanium suicides are formed on sidewall source/drain regions, gate electrode and the contact portion of the bottom surface within the trench.

U.S. Pat. No. 5,879,998 to Krivokapic describes a method of manufacturing very short channel length devices having source and drain regions in a substrate and a gate region on the top surface of the substrate between the source/drain regions. A silicide layer is used to establish separate local interconnect layers from the source and drain regions to respective source and drain metal contacts.

U.S. Pat. No. 5,918,130 to Hause et al. describes a method for fabricating a transistor by forming a silicide layer across the source/drain regions before formation of the gate conductor. A polycide layer is formed over the poly gate conductor.

SUMMARY OF THE INVENTION

Accordingly, it is an object of the present invention to provide a method of fabricating a raised source/drain transistor.

Another object of the present invention is to provide a method of fabricating a transistor having shallow source/drain junctions and thick salicide at the same time.

Other objects will appear hereinafter.

It has now been discovered that the above and other objects of the present invention may be accomplished in the following manner. Specifically, a silicon semiconductor substrate having a pad oxide portion within an active area is provided. A polysilicon layer is deposited over the silicon semiconductor substrate and over the pad oxide portion. A pad oxide layer is deposited over the polysilicon layer. Shallow isolation trench regions are formed on either side of the active area. The pad oxide layer is removed. The polysilicon layer is etched and removed over the pad oxide portion leaving polysilicon portions between the pad oxide portion and the shallow isolation trench regions. The pad oxide portion is replaced with a gate oxide portion. A gate conductor, having exposed side walls, is formed over the gate oxide portion and between the polysilicon portions. Sidewall spacers are formed on the exposed side walls of the gate conductor with the sidewall spacers contacting the polysilicon portions. Source/drain regions are formed in the active area under the sidewall spacers and under the polysilicon portions. A salicide portion is formed over the gate conductor and salicide portions are formed over the polysilicon portions, whereby the formation of the salicide layers over the polysilicon portions consumes a portion of the polysilicon portions leaving the remainder of the polysilicon layers to form shallow source/drain junctions underneath the polysilicon portion salicide portions.

BRIEF DESCRIPTION OF THE DRAWINGS

The features and advantage of the method of fabricating a silicon-on-insulator transistor device according to the present invention will be more clearly understood from the following description taken in conjunction with the accompanying drawing in which like numerals designate similar or corresponding elements, regions and portion which.

DETAILED DESCRIPTION OF THE PREFERRED EMBODIMENT

Figure 1:
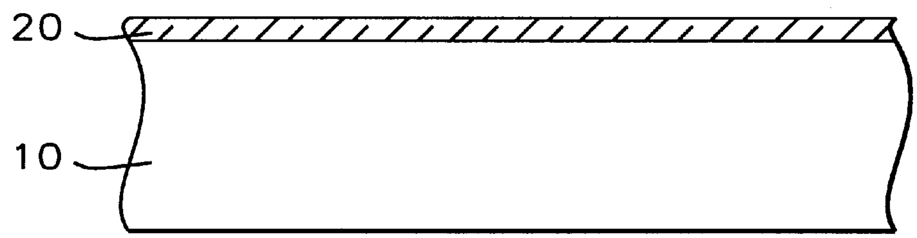
FIGS. 1–7 schematically illustrates in cross-sectional representation a preferred embodiment of the present invention.

Accordingly as shown in FIG. 1, starting semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Unless otherwise specified, all structures, layers, etc. may be formed or accomplished by conventional methods known in the prior art.

First pad oxide layer 20 (i.e. $SiO_2$) is deposited or grown over semiconductor structure silicon layer 12 to a thickness from about 100 to 400 Å, more preferably from about 180 to 220 Å, and most preferably about 200 Å.

Figure 2:
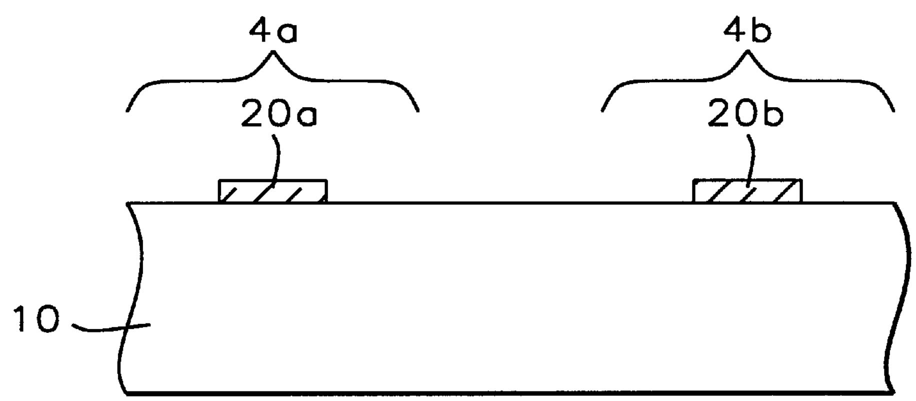

As shown in FIG. 2, first pad oxide layer 20 is patterned to form pad oxide portion 20*a* within active area 4*a* and pad oxide portion 20*b* within active area 4*b*. Active areas 4*a*, 4*b* have a width from about 3000 to 100,000 Å, and more preferably from about 3500 to 10,000 Å. Although for purposes of illustration, two transistor devices are shown being formed, it is obvious that only a single transistor device, or more than two transistor devices, may be formed according to the present invention. That is, for example, only a single transistor having either the 'a' or 'b' suffixes appended to like numbers need be formed with one set of shallow isolation trenches bracketing that transistor.

Figure 3:
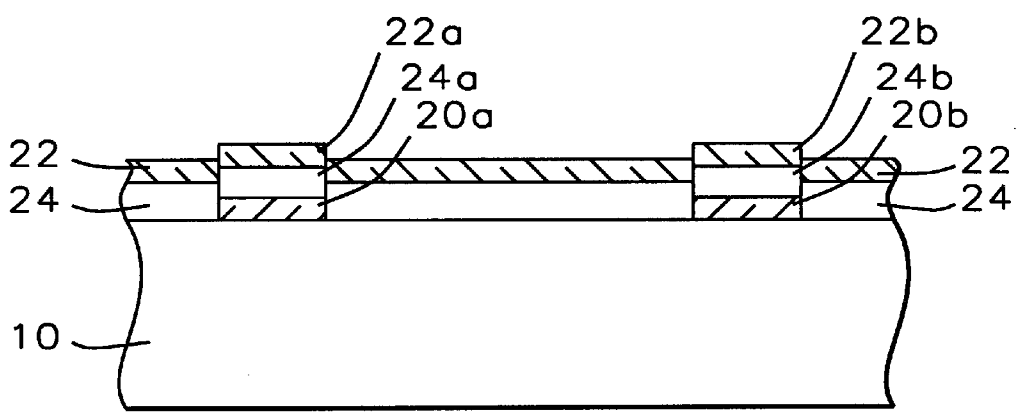

As shown in FIG. 3, polysilicon layer 24 is deposited over the structure of FIG. 2 with polysilicon portions 24*a*, 24*b* over pad oxide portions 20_a_, 20_b_, respectively. Polysilicon layer 24 with polysilicon portions 24_a_, 24_b_ have a thickness of from about 100 to 1000 Å, more preferably from about 280–320 Å, and most preferably about 300 Å.

Second pad oxide layer 22 is then deposited over polysilicon layer 24 with second pad oxide layer portions 22_a_, 22_b_ overlying polysilicon layer portions 24_a_, 24_b_, respectively. Pad oxide layer 22 with portions 22_a_, 22_b_ have a thickness of from about 100 to 400 Å and more preferably 200 Å.

Figure 4:
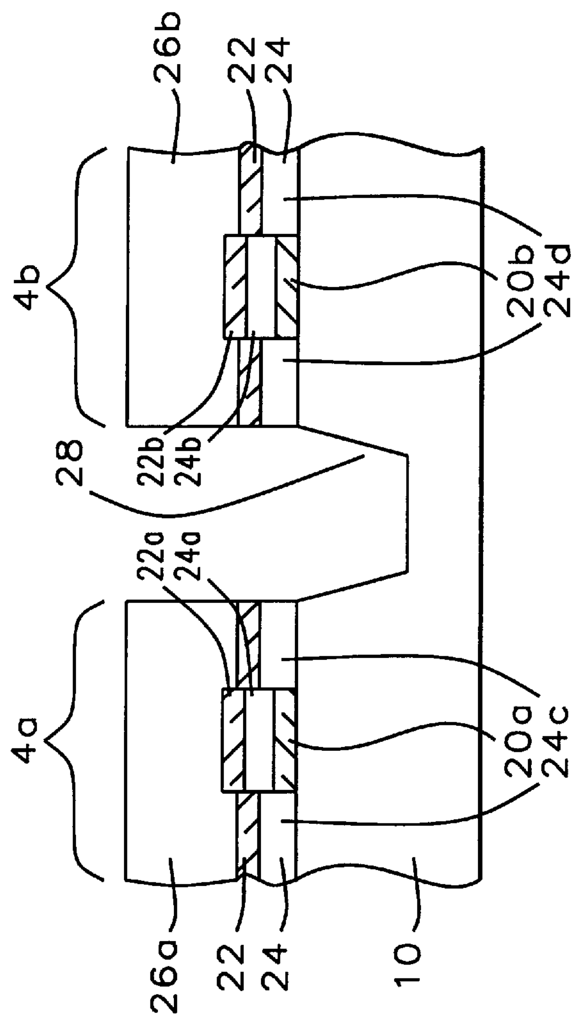

As shown in FIG. 4, masking layer 26 is formed over polysilicon layer 24 and patterned to form portions 26_a_, 26_b_ over respective active areas 4_a_, 4_b_. The portions of polysilicon layer 24 and second pad oxide layer 22 not within active areas 4_a_, 4_b_, and therefore not masked by masking layer (hard mask) portions 26_a_, 26_b_, respectively, are also removed to expose portions of the upper surface of semiconductor structure 10 on either side of active areas 4_a_, 4_b_ (also see FIG. 5 et al.)

Masking layer 26 has a thickness from about 1000 to 3000 Å, more preferably from about 1500 to 1900, and most preferably about 1700 Å, and may be comprised of SiON, or polyimide and more preferable is comprised of silicon nitride ($Si_3N_4$ or SiN).

Figure 5:
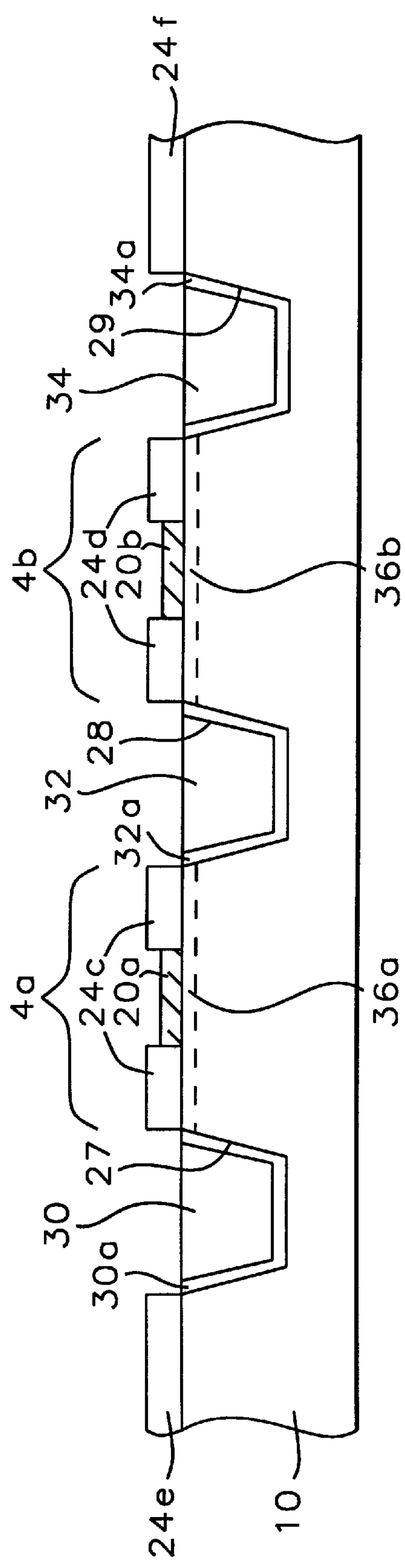

The exposed portions of semiconductor structure 10 are then etched to form shallow isolation trenches 27, 28, 29 between active areas 4_a_, 4_b_ at 28, and on the outboard sides of active areas 4_a_, 4_b_ at 27, 29, respectively (see FIG. 5 et al.). Trenches 27, 28, 29 have a depth from about 1000 to 6000 Å, and more preferably from about 2500 to 4000 Å.

As shown in FIG. 5, trenches 27, 28, 29 may be lined with optional liners 30_a_, 32_a_, 34_a_, respectively. Liners 30_a_, 32_a_, 34_a_ may be formed of SiON, or $Si_3N_4$/SiN and more preferably grown $SiO_2$. Lined trenches 27, 28, 29 are then filled with a dielectric material, preferably $SiO_2$, and planarized to form STIs 30, 32, 34, respectively, which serve to isolate active areas 4_a_, 4_b_.

Remaining masking layer 26 is removed along with remaining second pad oxide layer 22 with second pad oxide layer portions 22_a_, 22_b_. This oxide etch also etches back the STI oxide in STI trenches 30, 32, 34.

Polysilicon layer portions 24_a_, 24_b_ are selectively etched and removed from pad oxide portions 20_a_, 20_b_ leaving: polysilicon layer portions 24_c_, 24_d_ within active areas 4_a_, 4_b_, on either side of pad oxide portions 20_a_, 20_b_, respectively; and polysilicon layer portions 24_e_, 24_f_ outboard of STIs 30, 34, respectively. The polysilicon layer portions 22_a_, 22_b_ over pad oxide portions 20_a_, 20_b_, respectively, are preferably etched by a photoresist mask (not shown) followed by an etch step and then removal of the photoresist mask.

Well implants (not shown) are formed in semiconductor structure 10 within active regions 4_a_, 4_b_. $V_t$ implants 36_a_, 36_b_ are formed in semiconductor structure 10 within active regions 4_a_, 4_b_ followed by punchthrough (Pth) implants (not shown) to prevent channel punchthrough.

Figure 6:
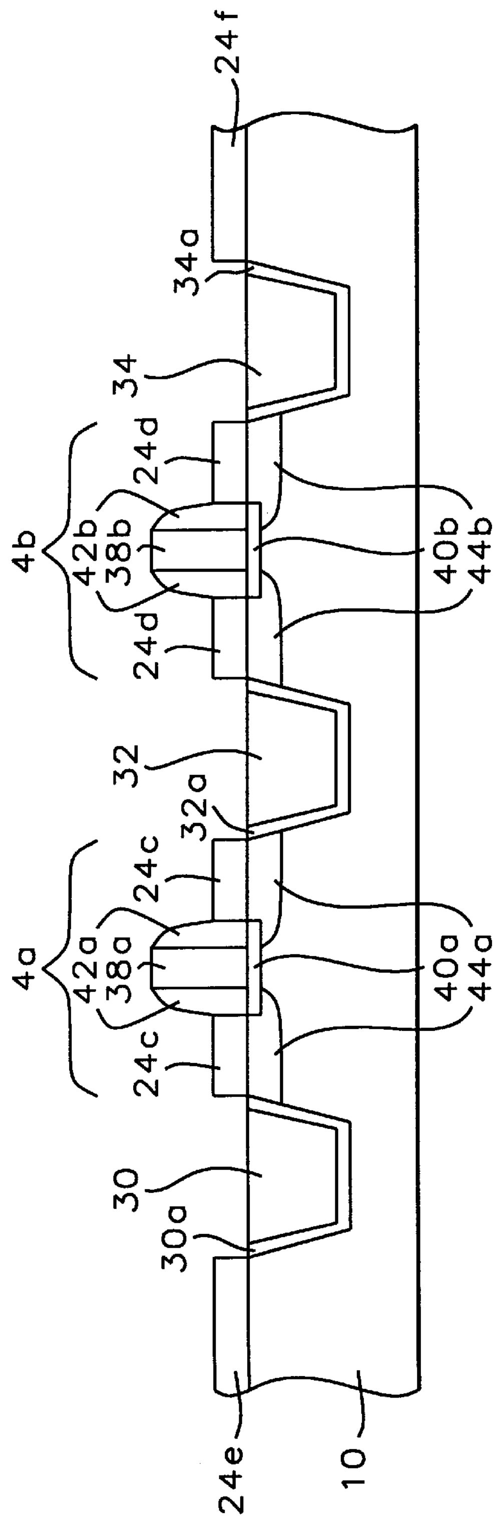

As shown in FIG. 6, pad oxide portions 20_a_, 20_b_ are removed and gate oxide portions (i.e. $SiO_2$) are formed 40_a_, 40_b_ within active areas 4_a_, 4_b_, respectively. Gate oxide portions 20_a_, 20_b_ are from about 18 to 22 Å thick, and more preferably are about 20 Å thick.

A polysilicon gate conductor layer, from about 1000 to 4000 Å, more preferably from about 2000 to 3000 Å, and most preferably about 2000 Å thick, is deposited and etched to form gate conductors 38_a_, 38_b_ each having exposed side walls. Gate conductors 38_a,_ 38_b_ are therefore from about 1000 to 4000 Å, more preferably from about 2000 to 3000 Å, and most preferably about 2000 Å high. Polysilicon gate conductors 38_a_, 38_b_ are preferably doped in situ during the formation of the polysilicon gate conductor layer.

Lightly doped source/drain (LDD) implants 44_a_, 44_b_ are then formed within active areas 4_a_, 4_b_, respectively, of semiconductor structure 10 outboard of gate conductors 38_a_, 38_b_, respectively.

An oxide spacer layer, or more preferably a silicon nitride ($Si_3N_4$, or "SiN") spacer layer, is deposited and etched to form SiN (for example) sidewall spacers 42_a_, 42_b_ on the exposed side walls of gate conductors 38_a_, 38_b_, respectively. Sidewall spacers 42_a_, 42_b_ have a bottom width of from about 200 to 2000 Å, and more preferably 400 Å.

Figure 7:
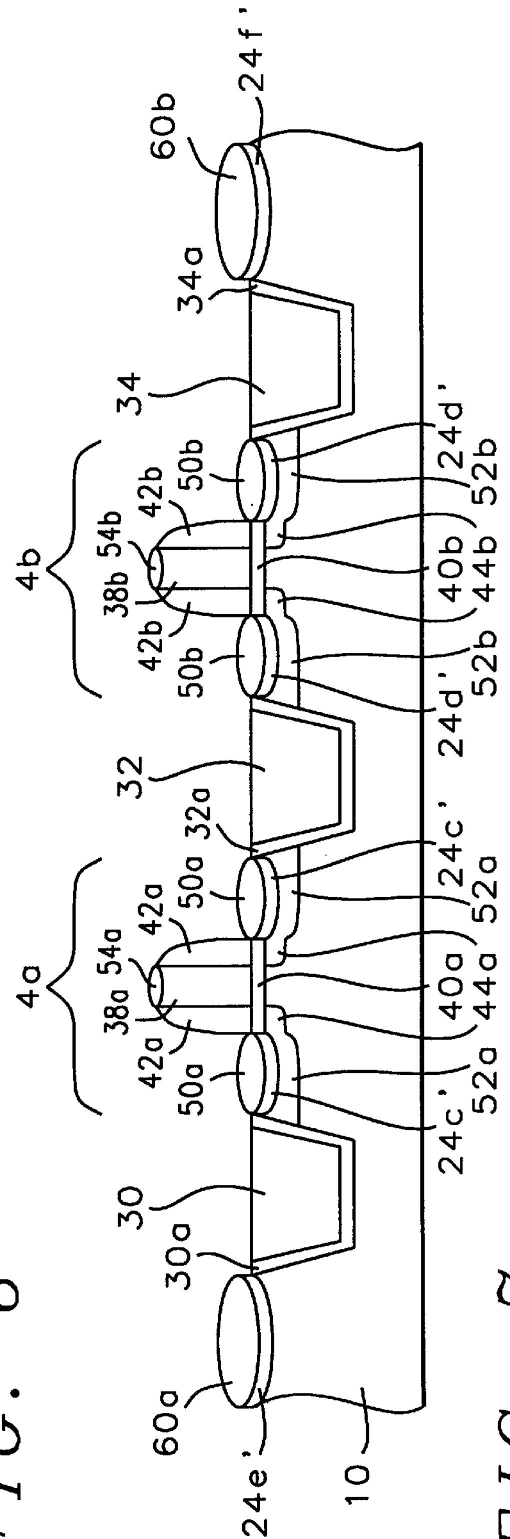

As shown in FIG. 7, source/drain implants are performed to form heavily doped source/drains (HDD) 52_a_, 52_b_ extending from LDD implants 44_a_, 44_b_ within active areas 4_a_, 4_b_, respectively, outboard of sidewall spacers 42_a_, 42_b_, respectively.

Metal salicide (self-aligned silicide) 50_a_, 50_b_; 54_a_, 54_b_; and 60_a_, 60_b_; may then be formed exclusively on exposed regions of: polysilicon layer portions 24_a_, 24_b_ within active areas 4_a_, 4_b_; gate conductors 38_a_, 38_b_; and polysilicon layer portions 24_e_, 24f outboard of STIs 30, 34, respectively. A refractory metal layer is deposited over the structure to a thickness, dependent upon the polysilicon thickness, for example from about 100 to 800 Å and more preferably 120 Å. The metal layer may be comprised of titanium (Ti) , nickel (Ni), platinum (Pt) or tungsten (W), and more preferably cobalt (Co).

Metal salicide 50_a_, 50_b_; 54_a_, 54_b_; and 60_a_, 60_b_ is then formed by exposing the Co layer to a form of radiation capable of increasing the temperature of the Co, such as thermal radiation from a heated furnace, or radiant light by a rapid thermal processing (RTP) technique. Raising the temperature of the Co layer initiates reaction between Co atoms and Si atoms of: polysilicon layer portions 24_a_, 24_b_ within active areas 4_a_, 4_b_; gate conductors 38_a_, 38_b_; and polysilicon layer portions 24_e_, 24_f_ outboard of STIs 30, 34, respectively, to form thick Co salicide ($CoSi_2$) 50_a_, 50_b_; 54_a_, 54_b_; and 60_a_, 60_b_, respectively. Metal salicide 50_a_, 50_b_; 54_a_, 54_b_; and 60_a_, 60_b_ have a thickness from about 100 to 800 Å and more preferably from about 300 to 600 Å.

Any remaining unwanted refractory Co, for example, may be etched away by using, for example, a wet etch highly selective to Co (or the selected metal). The resulting $CoSi_2$ 50_a_, 50_b_; and 54_a_, 54_b_, for example, has a relatively low resistivity and serves as a self-aligned contact region across source/drain regions 44_a_, 52_a_; 44_b_, 52_b_ and gate conductors 38_a_, 38_b_, respectively. Metal salicide 60_a_, 60_b_ outboard of active areas 4_a_, 4_b_ may be within source/drain regions for other adjacent transistors.

It is noted that polysilicon layer portions 24_a_, 24_b_ within active areas 4_a_, 4_b_; and polysilicon layer portions 24_e_, 24_f_ outboard of STIs 30, 34 have a thickness sufficient to provide the source of silicon to be consumed during the salicide process to form salicide 50_a_, 50_b_; and 60_a_, 60_b_ while still leaving shallow source/drain junctions 24_a_', 24_b_', and junctions 24_e_', 24_f_'. Shallow junctions 24_a_', 24_b_', 24_e_', 24_f_' have a depth from about 300 to 10,000 Å and more preferably from about 1200–2000 Å.

Thus the process of the present invention permits formation of a raised source/drain transistor having shallow source/drain junctions 44_a_, 52_a_; 44_b_, 52_b_ and thick salicide 50_a_, 50_b_, respectively, at the same time in raised source/drain transistors.

While particular embodiments of the present invention have been illustrated and described, it is not intended to limit the invention, except as defined by the following claims.

We claim:

1. A method of fabricating a transistor, comprising the steps of:

providing a silicon semiconductor substrate having a pad oxide portion within an active area;

depositing a polysilicon layer over said silicon semiconductor substrate and over said pad oxide portion;

depositing a pad oxide layer over said polysilicon layer;

forming shallow isolation trench regions on either side of said active area;

removing said pad oxide layer;

etching and removing said polysilicon layer over said pad oxide portion leaving polysilicon portions between said pad oxide portion and said shallow isolation trench regions;

replacing said pad oxide portion with a gate oxide portion;

forming a gate conductor, having exposed side walls, over said gate oxide portion and between said polysilicon portions;

forming sidewall spacers on said exposed side walls of said gate conductor; said sidewall spacers contacting said polysilicon portions;

forming source/drain regions in said active area under said sidewall spacers and said polysilicon portions; and forming a salicide portion over said gate conductor and salicide portions over said polysilicon portions;

whereby said formation of said salicide layers over said polysilicon portions consumes a portion of said polysilicon portions leaving the remainder of said polysilicon portions to form shallow source/drain junctions underneath said polysilicon portion salicide portions.

2. The method of claim 1, wherein said active area is from 3000 to 100,000 Å wide; said trenches are from 1000 to 6000 Å deep; and said layer of polysilicon is from about 100 to 1000 Å thick.

3. The method of claim 1, wherein said active area is from about 3000 to 100,000 Å wide, said gate conductor is from about 1000 to 4000 Å high, and said sidewall spacers have a bottom width from about 200 to 2000 Å.

4. The method of claim 1, wherein said source/drain salicide portions have a thickness from about 100 to 800 Å, and said shallow source/drain junctions have a depth from about 800 to 10,000 Å.

5. The method of claim 1, wherein said source/drain salicide portions have a thickness from about 300 to 600 Å, and said shallow source/drain junctions have a depth from about 1200 to 2000 Å.

6. The method of claim 1, including the following steps:

forming a well within said semiconductor structure within said active area;

forming a threshold voltage implant within said semiconductor structure within said active area; and forming a punchthrough implant within said semiconductor structure within said active area.

7. A method of fabricating a transistor, comprising the steps of:

providing a silicon semiconductor substrate having a patterned pad oxide portion within an active area;

depositing a first layer of polysilicon over said silicon semiconductor substrate and said pad oxide portion;

depositing a layer of pad oxide over said first polysilicon layer;

depositing and patterning a layer of SiN over said pad oxide layer;

forming two trenches bracketing said active area;

filling said trenches with planarized $SiO_2$ to form two STIs;

removing said patterned SiN layer and said pad oxide layer from said first polysilicon layer;

selectively etching and removing said polysilicon layer from said pad oxide portion leaving polysilicon portions in said active area;

forming a well within said semiconductor structure within said active area;

forming a threshold voltage implant within said semiconductor structure within said active area;

forming a punchthrough implant within said semiconductor structure within said active area;

removing said pad oxide portion from between said active area polysilicon portions;

forming a gate oxide portion between said active area polysilicon portions;

depositing and patterning a second layer of polysilicon to form a gate conductor having exposed side walls over said gate oxide portion;

forming lightly doped source/drain regions proximate said gate conductor within said semiconductor structure within said active area;

depositing and etching a layer of SiN to form sidewall spacers on said exposed side walls of said gate conductor;

forming heavy doped source/drain regions within said semiconductor structure within said active areas outward of said sidewall spacers; and forming salicide portions over said gate conductor, and over said source drain regions from a portion of said active area polysilicon portions;

whereby said source/drain region salicide portions have shallow junctions thereunder comprised of the remaining active area polysilicon portions.

8. The method of claim 7, wherein said active area is from 3000 to 100,000 Å wide; said trenches are from 1000 to 6000 Å deep; and said first layer of polysilicon is from about 100 to 1000 Å thick.

9. The method of claim 7, wherein said source/drain salicide portions have a thickness from about 100 to 800 Å, and said shallow source/drain junctions have a depth from about 800 to 10,000 Å.

10. The method of claim 7, wherein said source/drain salicide portions have a thickness from about 100 to 800 Å, and said shallow source/drain junctions have a thickness from about 1200 to 2000 Å.

11. The method of claim 7, wherein said active area is from about 3000 to 100,000 Å wide, said gate conductor is from about 1000 to 4000 Å high, said sidewall spacers have a bottom width from about 200 to 2000 Å.

12. A method of fabricating a transistor, comprising the steps of:

providing a silicon semiconductor substrate having a patterned pad oxide portion from about 100 to 400 Å thick within an active area from about 3000 to 100,000 Å wide;

depositing a first layer of polysilicon from about 100 to 1000 Å thick over said silicon semiconductor substrate and said pad oxide portion;

depositing a layer of pad oxide from about 100 to 400 Å thick over said first polysilicon layer;

depositing and patterning a layer of SiN from about 1000 to 3000 Å thick over said pad oxide layer;

forming two trenches from about 1000 to 6000 Å deep bracketing said active area;

filling said trenches with planarized $SiO_2$ to form two STIs;

removing said patterned SiN layer and said pad oxide layer from said first polysilicon layer;

selectively etching and removing said polysilicon layer from said pad oxide portion leaving polysilicon portions in said active area;

forming a well within said semiconductor structure within said active area;

forming a threshold voltage implant within said semiconductor structure within said active area;

forming a punchthrough implant within said semiconductor structure within said active area;

removing said pad oxide portion from between said active area polysilicon portions;

forming a gate oxide portion from about 18 to 22 Å thick between said active area polysilicon portions;

depositing and patterning a second layer of polysilicon from about 1000 to 4000 Å thick to form a gate conductor having exposed side walls over said gate oxide portion;

forming lightly doped source/drain regions proximate said gate conductor within said semiconductor structure within said active area;

depositing and etching a layer of SiN to form sidewall spacers having a bottom width from about 200 to 2000 Å on said exposed side walls of said gate conductor;

forming heavy doped source/drain regions within said semiconductor structure within said active areas outward of said sidewall spacers and extending from said lightly doped source drains; and forming cobalt salicide portions having a thickness from about 100 to 800 Å thick over said gate conductor, and over said source drain regions from a portion of said active area polysilicon portions;

whereby said source/drain region salicide portions have shallow junctions from about 800 to 10,000 Å thick thereunder comprised of the remaining active area polysilicon portions.

13. The method of claim 12, wherein said patterned pad oxide portion is from about 180 to 220 Å thick; said first layer of polysilicon is from about 280–320 Å thick; said pad oxide layer is from about 180 to 220 Å thick; said layer of SiN is from about 1500 to 1900 Å thick; said trenches are from about 2500 to 4000 Å deep; said gate oxide portion is from about 19 to 21 Å thick; said second layer of polysilicon is from about 2000 to 3000 Å thick; and said SiN sidewall spacers have a bottom width from about 380 to 420 Å.

14. The method of claim 12, wherein said cobalt salicide portions are from about 300 to 600 Å thick; and said source/drain salicide shallow junctions are from about 1200 to 2000 Å thick.

* * * * *